United States Patent
DeBrosse et al.

(10) Patent No.: US 7,453,740 B2
(45) Date of Patent: Nov. 18, 2008

(54) METHOD AND APPARATUS FOR INITIALIZING REFERENCE CELLS OF A TOGGLE SWITCHED MRAM DEVICE

(75) Inventors: John K. DeBrosse, Colchester, VT (US); Mark C. H. Lamorey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 11/624,707

(22) Filed: Jan. 19, 2007

(65) Prior Publication Data

US 2008/0175043 A1 Jul. 24, 2008

(51) Int. Cl.
G11C 7/06 (2006.01)
(52) U.S. Cl. ............................ 365/189.07; 365/189.05; 365/158
(58) Field of Classification Search ............ 365/189.07, 365/189.05, 189.09, 158
See application file for complete search history.

(56) References Cited

U.S. PATENT DOCUMENTS

| | | | |
|---|---|---|---|
| 5,844,832 A | 12/1998 | Kim | |
| 6,269,040 B1 | 7/2001 | Reohr et al. | |
| 6,545,906 B1 | 4/2003 | Savtchenko et al. | |
| 6,597,601 B2 * | 7/2003 | Ooishi | 365/171 |
| 6,791,869 B2 * | 9/2004 | Ooishi | 365/158 |
| 6,807,088 B2 | 10/2004 | Tsuchida | |
| 6,940,772 B1 | 9/2005 | Horch et al. | |
| 7,254,063 B2 * | 8/2007 | Mori | 365/185.22 |
| 2002/0071317 A1 | 6/2002 | Bohm et al. | |
| 2004/0027906 A1 | 2/2004 | Ooishi et al. | |
| 2004/0125653 A1 | 7/2004 | Tran et al. | |
| 2004/0160811 A1 | 8/2004 | Tsuchida | |
| 2005/0047219 A1 | 3/2005 | Perner et al. | |
| 2006/0239073 A1 * | 10/2006 | Toda | 365/185.03 |
| 2007/0195585 A1 * | 8/2007 | Sakimura et al. | 365/158 |

* cited by examiner

*Primary Examiner*—Tuan T. Nguyen
(74) *Attorney, Agent, or Firm*—Cantor Colburn LLP; Michael J. LeStrange

(57) ABSTRACT

A method of determining an initial state of a reference cell in a fabricated memory array includes performing a first read operation of the reference cell by comparing current through the reference cell with the average current passing through a pair of data cells, and storing the result of the first read operation; inverting the value of one of the pair of the data cells; performing a second read operation of the reference cell, and storing the result of the second read operation; inverting the value of the other of the pair of the data cells; performing a third read operation of the reference cell, and storing the result of the third read operation. A majority compare operation of the results of the first, second and third operations is performed, wherein the result of the majority compare operation is the initial state of the reference cell.

14 Claims, 4 Drawing Sheets

| DataA | DataB | RefA | SAoutA | CONCLUSION |
|---|---|---|---|---|
| 0 | 0 | 0 | X | RefA MUST BE 0 |
| 0 | 1 | 0 | 0 | |
| 1 | 0 | 0 | 0 | |
| 1 | 1 | 0 | 0 | |

*FIG. 3(a)*

| DataA | DataB | RefA | SAoutA | CONCLUSION |
|---|---|---|---|---|
| 0 | 0 | 1 | 1 | RefA MUST BE 1 |
| 0 | 1 | 1 | 1 | |
| 1 | 0 | 1 | 1 | |
| 1 | 1 | 1 | X | |

*FIG. 3(b)*

METHOD AND APPARATUS FOR INITIALIZING REFERENCE CELLS OF A TOGGLE SWITCHED MRAM DEVICE

BACKGROUND

The present invention relates generally to data sensing within semiconductor memory devices and, more particularly, to method and apparatus for initializing reference cells of a toggle switched memory device.

Magnetic (or magneto-resistive) random access memory (MRAM) is a non-volatile random access memory technology that could replace the dynamic random access memory (DRAM) and/or static random access memory (SRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is maintained in a preassigned direction, while the magnetic moment of the magnetic layer on the other side of the tunnel barrier (also referred to as a "free" layer) may be switched during operation between the same direction and the opposite direction with respect to the fixed magnetization direction of the reference layer. The orientations of the magnetic moment of the free layer adjacent to the tunnel junction are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is typically "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of fields to exceed a critical curve or stability threshold, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy, and shape anisotropy of the MTJ.

When a sufficiently large current is passed through both a wordline and a bitline of the MRAM, the combined fields of these currents at the intersection of the write and bit lines will switch the magnetization of the free layer of the particular MTJ located at the intersection of the energized write and bit lines. The current levels are selected such that the combined fields exceed the switching threshold of the free layer. For a Stoner-Wohlfarth astroid MRAM structure, the EA is aligned with the orientation of either the bitline or the wordline.

As the lateral dimension of an MRAM device decreases, several problems can occur. First, the switching field increases for a given shape and film thickness, thus requiring a larger magnetic field for switching. Second, the total switching volume is reduced such that the energy barrier for reversal also decreases, wherein the energy barrier refers to the amount of energy needed to switch the magnetic moment vector from one state to the other. The energy barrier determines the data retention and error rate of the MRAM device, and thus unintended reversals can occur due to thermal fluctuations if the barrier is too small. Furthermore, with a small energy barrier it becomes extremely difficult to selectively switch a single MRAM device in an array without inadvertently switching other MRAM devices. Thirdly, the shape anisotropy becomes dominant and the switching field becomes more sensitive to shape variations as the MRAM devices decrease in size.

In this regard, there has also been introduced an MRAM device in which the free layer of ferromagnetic material includes multiple (e.g., two) ferromagnetic layers separated by a nonmagnetic coupling layer. Due to magnetostatic coupling, the magnetic moments of the two ferromagnetic layers are antiparallel to one another. This configuration allows for a different method of writing that improves selectivity. An exemplary configuration aligns the axis of intrinsic magnetic anisotropy at a 45° angle with respect to the orientation of the word and bitlines. The device can be patterned to include shape anisotropy, and in an exemplary configuration is also aligned at a 45° angle with respect to the orientation of the word and bitlines.

More specifically, the writing method relies on a toggle or "spin-flop" phenomenon that gently rotates the magnetic moment vectors of the two ferromagnetic layers so they exchange directions. In the X-Y field plane, the fields follow a closed trajectory or "toggle-box" that encloses a critical point called the spin-flop point. The magnitudes of the required fields are dependent on the location of this spin-flop point. Current waveforms applied to the wordline and bitline in a timed sequence induce a magnetic field trajectory which reliably toggles the state of the multifilm free layer, such that the magnetization of the film closest to the tunnel barrier will switch direction (i.e., "toggle"), and at remanence the partner film in the free layer maintains an antiparallel magnetization to the aforementioned film. Additional information regarding toggle based MRAM writing may be found in, for example, U.S. Pat. No. 6,545,906 to Savtchenko, et al. Thus, in order to write a toggle based MTJ into a given state, it is first necessary to determine its initial state and then toggle it if required.

A common method for reading conventional MTJs is to apply a voltage and compare the resulting current to that of one or more reference MTJs of known state. Accordingly, such reference cells must first be initialized to a known state. However, this is difficult in a toggle switched memory since no such independent reference exists for determining the initial state of the reference cells themselves in the first place. That is, the write operation of a toggle mode device operates by changing the logical state of the cell. In other words, if the state of a reference cell is not known in the first place, toggling the cell simply changes its state without knowledge of what the previous or current state of the cell is. Accordingly, it would be desirable to be able to first determine an initial state of the reference cells in a toggle switched memory, so that the references may thereafter be initialized to desired values for operation of the memory device.

SUMMARY

The foregoing discussed drawbacks and deficiencies of the prior art are overcome or alleviated by a method of determining an initial state of a reference cell in a fabricated memory array, including performing a first read operation of the reference cell by comparing current through the reference cell with the average current passing through a pair of data cells, and storing the result of the first read operation; inverting the value of one of the pair of the data cells; performing a second read operation of the reference cell, and storing the result of the second read operation; inverting the value of the other of the pair of the data cells; performing a third read operation of the reference cell, and storing the result of the third read operation. A majority compare operation of the results of the first, second and third operations is performed, wherein the result of the majority compare operation is the initial state of the reference cell.

In another embodiment, a method of initializing a reference cell in a switched based MRAM device includes performing a first read operation of the reference cell by comparing current through the reference cell with the average current passing through a pair of data cells, and storing the result of the first read operation; inverting the value of one of the pair of the data cells; performing a second read operation of the reference cell, and storing the result of the second read operation; inverting the value of the other of the pair of the data cells; performing a third read operation of the reference cell, and storing the result of the third read operation; performing a majority compare operation of the results of the first, second and third operations, wherein the result of the majority compare operation is the initial state of the reference cell and toggling the reference cell in the event the initial state of the reference cell does not match a desired state of the reference cell.

In still another embodiment, an apparatus for initializing a reference cell in a toggle switched MRAM device includes a first sense amplifier configured for performing a first read operation of the reference cell by comparing current through the reference cell with the average current passing through a pair of data cells; a first latch for storing the result of the first read operation; a second latch for storing the result of a second read operation by the first sense amplifier, wherein the second read operation is performed following the first read operation and the inversion of the value of one of the pair of the data cells; a third latch for storing the result of a third read operation by the first sense amplifier, wherein the third read operation is performed following the second read operation and the inversion of the value of the other of the pair of the data cells; and a majority compare device configured to compare of the results of the first, second and third operations respectively stored in the first, second and third latches, wherein an output of the majority compare operation is the initial state of the reference cell.

BRIEF DESCRIPTION OF THE DRAWINGS

Referring to the exemplary drawings wherein like elements are numbered alike in the several Figures:

FIGS. 3(a) and 3(b) are truth tables illustrating the operation of the method depicted in FIG. 2.

DETAILED DESCRIPTION

Disclosed herein is a method and circuit for determining the unknown initial state of a reference cell in a toggle switched memory device, so that the cell may be initialized to a desired state for operation of the memory device. Because a toggle switched memory device changes the state of a cell in the toggle mode (as opposed to initializing to a specific value during a write operation), the initial state of a reference cell must first be determined before initialization to a desired state. Briefly stated, a memory device is configured such that the value of the reference is "read" by comparison between current flowing through the reference cell and an average of current through two data cells. The read operation is implemented three times: a first read, a second read after toggling a first of the two data cells, and a third read after toggling a second of the two data cells. In each case, the initial state of the reference cell being read is not changed. As a result of the three separate read operations, at least two of the outcomes will reflect the true initial state of the unknown reference cell. This true initial state of the reference cell may then be used to initialize the reference cell by either toggling the cell or not, depending on whether the actual initial state of the reference cell equals the desired initial state of the reference cell.

Figure 1:
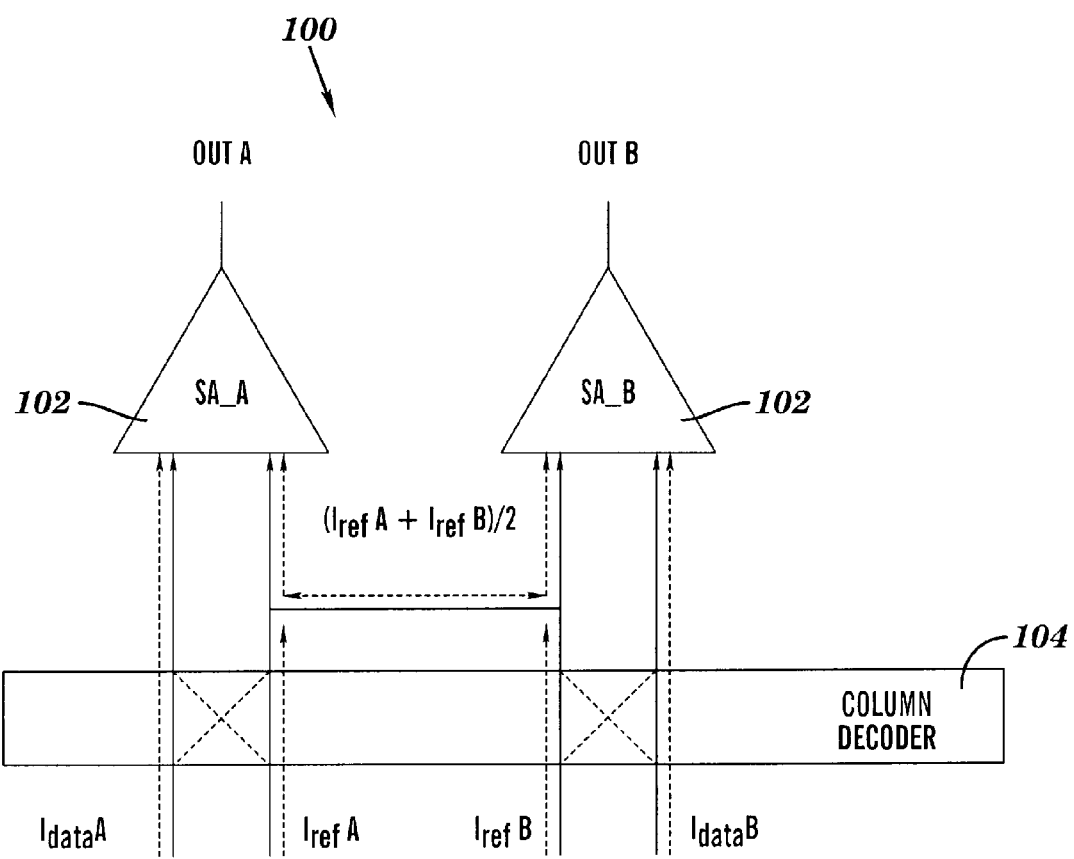
FIG. 1 is a schematic diagram of a portion of a memory read circuit suitable for use in accordance with an embodiment of the invention.

Referring initially to FIG. 1, there is shown a schematic diagram of a portion of a memory read circuit 100, suitable for use in accordance with an embodiment of the invention. As is shown, the circuit includes a pair of sense amplifiers 102 (also labeled SA_A and SA_B) that nominally compare a current passing through a data cell with a reference current to read the state of the data cell. For example, during actual use of the circuit 100, SA_A reads the state of the data stored by a first cell, based on the current passed therethrough (e.g., $I_{data}$ A) when a voltage is applied to the cell. In particular, $I_{data}$ A is compared to a reference current, which is generated by averaging the currents through a pair of reference cells that are initialized to opposite data states. In the circuit depicted, this reference current is the average of the currents $I_{ref}A$ and $I_{ref}B$ as these inputs are shorted prior to the inputs of SA_A and SA_B. Notably, this average current is also used by SA_B to read the data of a second cell, through a comparison with $I_{data}$ B.

However, as indicated above, in order for the memory device to be used as designed, the data in the reference cells must be initialized to proper states to insure that the value of $I_{ref}A$ corresponds to the opposite logical value with respect to $I_{ref}B$ so that the average of the two results is a current between the two logic states. As a practical matter, the states of the various data and reference cells of a newly fabricated MRAM device are of random magnetic orientations (and thus have random logic values stored therein). Because toggle based memory devices change the state of a cell instead of initializing the cell to a certain logic value, a convenient way is needed to first initialize the reference cells. But, before the reference cells are initialized, the initial states thereof must first be determined, since the initialization of a reference cell will be implemented by either toggling the reference cell to the opposite value, or by not toggling the reference cell to keep its initial value.

Thus, as further shown in FIG. 1, a column decoder 104 is configured with the capability of switching the current paths of the data cells with the current paths of the reference cells, with respect to the sense amplifier inputs. In so doing, the data cells can "swap roles" with the reference cells, in that the state of a reference cell can be compared to the average of two data cells. The purpose of this capability will be understood with reference to FIGS. 2, 3(a) and 3(b).

Figure 2:
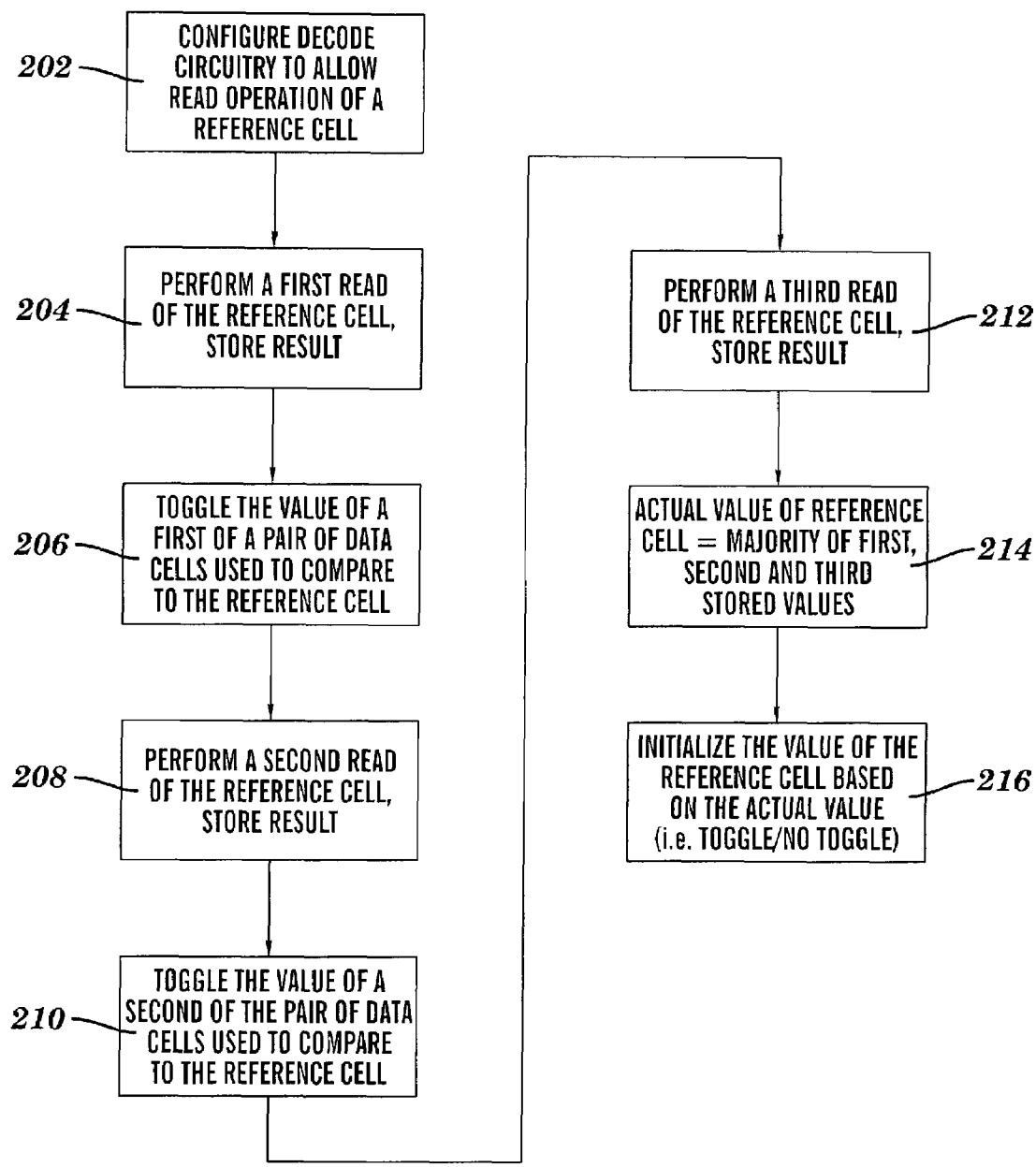
FIG. 2 is a block diagram illustrating a method for initializing a reference cell by first determining the state of the cell, in accordance with an embodiment of the invention.

In particular, FIG. 2 is a block diagram illustrating a method 200 for initializing a reference cell by first determining the state of the cell, in accordance with an embodiment of the invention. As shown in block 202, decode circuitry of a memory device is configured in a manner so as to allow a read operation of a reference cell. This can be done, for example, through switching of the column decoder circuitry 104 in FIG. 1. Once such switching is accomplished, a first read of the reference cell is performed, with the result thereof being stored, as shown in block 204 of FIG. 2. In particular, the current passing through the reference cell is compared to the average current through a first and a second data cell. Using the exemplary schematic of FIG. 1, the current through the reference cells ($I_{ref}A$, $I_{ref}B$) swaps positions with the current passing through the data cells ($I_{data}A$, $I_{data}B$) with respect to the sense amplifiers (SA_A, SA_B). Thus, in the case of reference cell A, SA_A compares $I_{ref}A$ to the average of $I_{data}A$ and $I_{data}B$.

At this point, none of the magnetic data stored within the reference cell or the data cells is known. Referring again to FIG. 2, the value of one of the data cells (e.g., either A or B) is toggled so as to invert its state (even though it is not known what that state is), as shown in block 206. Then, a second read of the reference cell (e.g., cell A) is performed, with the result thereof again being stored, as shown in block 208. It will be noted at this point that the same method for determining the value of reference cell B can be performed concurrently, since SA_B also utilizes the average currents of $I_{data}A$ and $I_{data}B$.

Proceeding to block 210, the value of the other of the two data cells not previously toggled is then toggled (e.g., either B or A), and a third read of the reference cell is thereafter performed as shown in block 212. The result of the third read is also stored. Once the third read is carried out, the actual value of the reference cell can then be determined by a majority compare between the results of the first, second and third read operations, as shown in block 214. Finally, in block 216, the reference cell can be initialized to the desired value by comparing the actual initial value to the desired value and toggling if appropriate.

FIGS. 3(a) and 3(b) are truth tables illustrating the logic by which three read operations of an unknown reference cell (using different combinations of values for the data cells, whose currents are combined and compared with the current through the reference cell) will yield the actual value of the reference cell. In FIG. 3(a), it is first assumed that the unknown value of the magnetic state of reference cell A is a low resistive or logic "0" state. There are four possible combinations of data states of data cell A and data cell B. Two of these combinations are the case where data cell A is the opposite state of data cell B. In both cases, this would represent a correct (designed) operation of a read circuit, in that the resulting average current would be roughly halfway between the current of a "1" cell and the current between a "0" cell. Therefore, when compared to the current of the reference cell having a value of "0", the sense amplifier will correctly provide an output that indicates the reference cell has a stored value of 0.

On the other hand, it is also possible that the data cells could have the same value stored therein initially (i.e., both are 1 or both are 0). If both the data cells are 0 and the reference cell is also 0, then the currents applied to SA_A are substantially the same, and thus the output of the sense amplifier is indeterminate, as reflected in FIG. 3(a). However, if both the data cells are 1 and the reference cell is 0, then the sense amplifier will provide the correct output with respect to the state of the reference cell, as also shown in FIG. 3(a). Therefore, it can be seen that even if the initial states of the data cells and the reference cells are unknown, a read operation performed for 3 of the 4 possible combinations will result in at least two correct results. As such, a majority compare of three read operations yields the true state of the reference cell.

The truth table of FIG. 3(b) demonstrates the logic where the actual state of the unknown reference cell is 1. Again, if the data cells are of opposite states, the sense amplifier output will correctly register a 1 on the output. Even if both the data cells were 0, then the sense amplifier would still generate a correct output of 1. However, if both the data cells and the reference cell are in the "1" state, then the output of the sense amplifier is indeterminate. Accordingly, reading three of these four possible states will allow for the identification of the true state of the reference cell.

Figure 4:
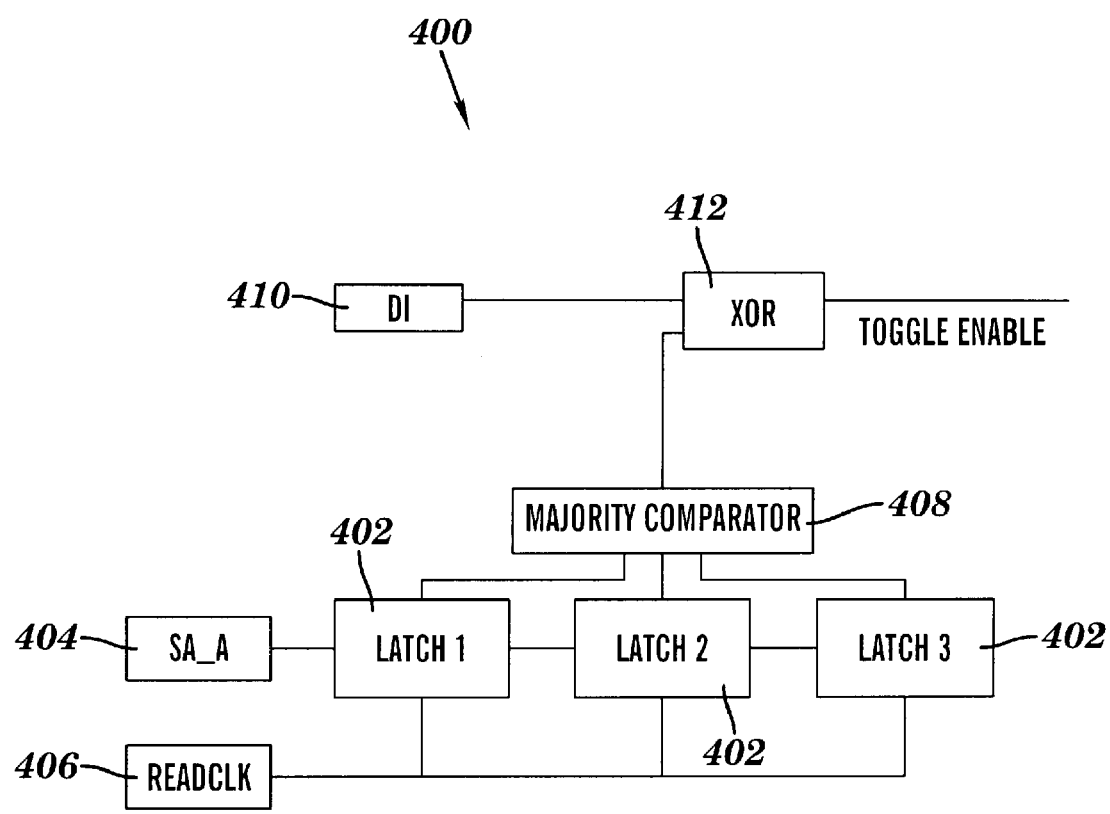
FIG. 4 is a schematic block diagram of an apparatus for implementing the method depicted in FIG. 2, in accordance with a further embodiment of the invention.

Finally, FIG. 4 is a schematic block diagram of an exemplary apparatus 400 suitable for implementing the method depicted in FIG. 2, in accordance with a further embodiment of the invention. As is shown, three master-slave triggered latches 402 sequentially store the last read data using a sense amplifier 404 (e.g., SA_A), passing the previously stored data to the next latch. The latches are enabled through an appropriate clock signal generated by clock signal source 406 (ReadClk). The data from each of the latches 402 (Latch 1, Latch 2, Latch 3) is inputted to a logic block 408 that performs a majority compare operation on the three data inputs. Naturally, the output of the majority comparator is only of interest after the three read operations have been performed and the results of each stored in the latches 402. As described above, the output of the majority comparator 408 represents the actual state of the reference cell. This output can therefore be compared to the desired state of the reference cell, represented in FIG. 4 by a data input (DI) block 410. Using, for example, exclusive OR (XOR) logic 412, a toggle enable signal that changes the state of the reference cell is activated whenever the actual state of the reference cell (majority compare output) differs from the desired state of the reference cell.

Thus configured, the above described method and apparatus embodiments provide an efficient means for determining the state of reference cells in MRAM devices that are switched during a toggle write operation. So long as at least three read operations of a reference cell are implemented (using different logic combinations of the pair of data cells), the state of the reference cell may be identified through a majority compare. It will further be appreciated that the fourth logic state could also be read and stored, and a majority compare will still correctly identify the state of the reference cell.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of determining an initial state of a reference cell in a fabricated memory array, the method comprising:
    performing a first read operation of the reference cell by comparing current through the reference cell with the average current passing through a pair of data cells, and storing the result of the first read operation;
    inverting the value of one of the pair of the data cells;
    performing a second read operation of the reference cell, and storing the result of the second read operation;
    inverting the value of the other of the pair of the data cells;
    performing a third read operation of the reference cell, and storing the result of the third read operation; and
    performing a majority compare operation of the results of the first, second and third operations;
    wherein the result of the majority compare operation is the initial state of the reference cell.

2. The method of claim 1, wherein the memory array comprises a toggle switched MRAM device.

3. The method of claim 2, further comprising switching a column decoder so as to couple the reference cell to a data input of a first sense amplifier and couple the average current passing through the pair of data cells to a reference input of the first sense amplifier.

4. The method of claim 3, further comprising using the average current passing through the pair of data cells to simultaneously determine an initial state of another reference cell associated with a second sense amplifier adjacent to the first sense amplifier.

5. The method of claim 4, wherein the reference input of the first sense amplifier is shorted to a reference input of the second sense amplifier.

6. A method of initializing a reference cell in a toggle switched MRAM device, the method comprising:
    performing a first read operation of the reference cell by comparing current through the reference cell with the average current passing through a pair of data cells, and storing the result of the first read operation;
    inverting the value of one of the pair of the data cells;
    performing a second read operation of the reference cell, and storing the result of the second read operation;
    inverting the value of the other of the pair of the data cells;
    performing a third read operation of the reference cell, and storing the result of the third read operation;
    performing a majority compare operation of the results of the first, second and third operations, wherein the result of the majority compare operation is the initial state of the reference cell and
    toggling the reference cell in the event the initial state of the reference cell does not match a desired state of the reference cell.

7. The method of claim 6, further comprising switching a column decoder so as to couple the reference cell to a data input of a sense amplifier and couple the average current passing through the pair of data cells to a reference input of the sense amplifier.

8. The method of claim 7, further comprising using the average current passing through the pair of data cells to simultaneously determine an initial state of another reference cell associated with a second sense amplifier adjacent to the first sense amplifier.

9. The method of claim 8, wherein the reference input of the first sense amplifier is shorted to a reference input of the second sense amplifier.

10. An apparatus for initializing a reference cell in a toggle switched MRAM device, the apparatus comprising:
    a first sense amplifier configured for performing a first read operation of the reference cell by comparing current through the reference cell with the average current passing through a pair of data cells;
    a first latch for storing the result of the first read operation;
    a second latch for storing the result of a second read operation by the first sense amplifier, wherein the second read operation is performed following the first read operation and the inversion of the value of one of the pair of the data cells;
    a third latch for storing the result of a third read operation by the first sense amplifier, wherein the third read operation is performed following the second read operation and the inversion of the value of the other of the pair of the data cells;
    and a majority compare device configured to compare the results of the first, second and third operations respectively stored in the first, second and third latches, wherein an output of the majority compare operation is the initial state of the reference cell.

11. The apparatus of claim 10, further comprising logic for toggling the reference cell in the event the initial state of the cell does not match a desired state of the reference cell.

12. The apparatus of claim 11, further comprising a column decoder configured to selectively couple the reference cell to a data input of the first sense amplifier and couple the average current passing through the pair of data cells to a reference input of the first sense amplifier.

13. The apparatus of claim 11, further comprising a second sense amplifier configured to simultaneously determine an initial state of another reference cell using the average current passing through the pair of data cells.

14. The apparatus of claim 13, wherein the reference input of the first sense amplifier is shorted to a reference input of the second sense amplifier.

* * * * *